United States Patent
Määttäet al.

(10) Patent No.: US 6,831,229 B1
(45) Date of Patent: Dec. 14, 2004

(54) HINGE COVER MECHANISM FOR FOLDING CASINGS WITH LIFT FUNCTION

(75) Inventors: Esa Määttä, Viiala (FI); Timo Herranen, Viiala (FI)

(73) Assignee: Nokia Corporation, Espoo (FI)

( * ) Notice: Subject to any disclaimer, the term of this patent is extended or adjusted under 35 U.S.C. 154(b) by 0 days.

(21) Appl. No.: 10/660,121

(22) Filed: Sep. 11, 2003

(51) Int. Cl.$^7$ ................................................. H05K 5/03
(52) U.S. Cl. ........................... 174/66; 174/67; 174/50; 174/50.51; 174/52.1; 361/687; 361/679; 361/680; 361/681; 248/917; 248/923
(58) Field of Search ............................ 174/66, 67, 50, 174/50.51, 52.1; 361/687, 679, 680, 681; 248/917, 923

(56) References Cited

U.S. PATENT DOCUMENTS

| | | | |
|---|---|---|---|
| 4,825,395 A | 4/1989 | Kinser, Jr. et al. | |
| 4,960,256 A | * 10/1990 | Chihara et al. | .......... 248/286.1 |
| 5,594,619 A | * 1/1997 | Miyagawa et al. | .......... 361/681 |
| 6,266,241 B1 | * 7/2001 | Van Brocklin et al. | ..... 361/687 |

* cited by examiner

Primary Examiner—Dean A. Reichard
Assistant Examiner—Anton Harris
(74) Attorney, Agent, or Firm—Ware, Fressola, Van Der Sluys & Adolphson LLP (57) ABSTRACT

A hinge cover mechanism for an electric device with a folding casing with at least a first casing part and a second casing part adjoined by a hinge mechanism includes a hinge cover component having at least first pivot means which cooperate with the second casing part to allow movement of the hinge cover component about a first cover pivot axis and second pivot means which cooperate with the first casing part to allow both linear movement of the hinge cover component and movement of the hinge cover component about a second cover pivot axis.

22 Claims, 4 Drawing Sheets

HINGE COVER MECHANISM FOR FOLDING CASINGS WITH LIFT FUNCTION

FIELD OF THE INVENTION

The present invention relates to a hinge cover mechanism for electric devices having foldable casing also called "folding casings" and in particular the present invention relates to hinge cover mechanisms of hinge mechanisms for aforesaid electric devices offering advantageous characteristics for protecting the hinge mechanism, electrical conductor means passing through the subject hinge mechanism and for providing lift and inclination functionality.

TECHNICAL BACKGROUND

The advantages of a design of electronic devices with folding casings is well known especially in the field of mobile and portable electronic devices, respectively. The advantages refer primarily to the usability of such electronic devices that are conventionally formed of two casing halves, which are pivoted by a hinge mechanism adjoining the two casing halves with each other. A folding casing may have at least two folding positions, i.e. a close position, in which both casing halves are stacked on the top of each other, and an open position, in which the surfaces of the casing halves, which face towards each other in the close position, are exposed to a user. The close position offers an advantageous shape for carrying the device by a user, whereas the open position allows for presenting a relative large area to the user for implementing operating/control components such as keyboards, keypad, joysticks, touchpads etc. and for display components. Moreover, these components, which are presented to a possible user in the open position of the electronic device, are protected against external influences in the close position. Conventionally, a main body representing a first casing half implements electronics and operating/control components, while a top body representing a second casing half implements display components. Such aforementioned electronic devices with folding casings known and employed for laptop and notebook computers, mobile phones, digital personal assistants, mobile communicators etc. only to list a selection of examples.

The hinge mechanism which provides for the junction of the casing halves and which allows for pivoting about at least one pivot axis is subject to several functional constraints. One constraint is focused by the design of the hinge mechanism itself and a second main problem emerging with the enabling of traversing electrical conductors through the hinge mechanism to have electrical connectivity between electrical and electronic components, respectively, implemented in the casing halves.

A flexible material in the form of a strip, flap etc. may allow realization of the hinge mechanism itself. Such a design of the hinge mechanism itself enables the pivoted operating of the hinge mechanism but this design is subjected to wear by the pivoting movements simultaneously such that this design may only allow for a limited number of pivoting movements (up to a maximum of several hundreds). More stable against frequent use are hinge mechanisms, which provide articulated hinges with articulated axles.

The electrical conducting of the two casing halves through the hinge mechanism is conventionally accomplished by flexible printed circuits (FPC), which are indeed printed wire boards (PWB), being manufactured from a flexible board material. Concerns refer to the electrical conductor and especially the mechanical stress applied thereto due to the bending and pivoting movements, respectively, as well as the protection of the electrical conductor against injury from external influences.

The bending radius of the electrical conductor determines the mechanical stress that can be applied to the electrical conductor by bending and pivoting movements. The bending radius is further determined by the dimensions of the hinge mechanism, which is primarily determined by the dimension constraints set by the size of the electronic device having folding casings. The smaller the dimensions of the electronic device, the smaller the dimensions of the hinge mechanism and therefore the smaller the bending radius such that consequently, mechanical stress, torsion, compressing, tension, etc. of the electrical conductor increases with decreasing the bending radius. The electrical conductor has to withstand the mechanical deformation effected by the bending movements applied thereon each time the hinge mechanism is operated and in particular the electrical conductor has to exhibit the ability to resist breakage thereof also after frequent bending cycles.

Furthermore, the electrical conductor has to be protected against accidental injury applied thereon from outside of the electronic device when the electronic device is in open position. A simple solution of this concern is to protect the electrical conductor by a covering such with a flap of flexible resistant protective material. But a simple coverage is normally not sufficient to protect against puncturing, cutting and any similar effects by sharp and pointed objects, respectively.

U.S. Pat. No. 4,825,395 discloses a hollow articulated hinge mechanism, which allows for routing electrical conductors therethrough. The articulated hinge mechanism is designed to enable one half of the two-piece folding casing to be rotated by one full revolution about the other half of the two-piece folding casing. The electrical conductors are subjected to distributed torsional stress during rotation movements which is taught by U.S. Pat. No. 4,825,395 to be superior to locally concentrated stress of compression and tension. The design of the disclosed hollow articulated hinge mechanism might be advantageous over conventional solutions enlightened above but has disadvantages, which contradict a common use. The space within the hollow articulated hinge mechanism for accommodating electrical conductors is limited due to the specific routing of the electrical conductors therethrough. Consequently, the number of electrical conductors is restricted. Moreover, the torsional deformation of the electrical conductors within the hollow articulated hinge mechanism also limits the number of electrical conductors to be routed through such that the concept of U.S. Pat. No. 4,825,395 is not universally applicable in the field of electronic devices with folding casings.

Generally in view of the above-presented introduction the present invention refers to an improved hinge cover mechanism, which is advantageous over the above referenced state of the art.

In detail, a first object of the present invention is to provide a hinge cover mechanism that serves for protecting electric conductors traversing from one of the casing part to another one to allow for electric conduction of electric components included therein. The protection refers among others to damages and wearing out effects, which may be caused by external (environmental) influences, i.e. manipulations, operations, impacts etc. caused from the outside of the hinge cover mechanism.

A second object of the present invention is to provide a hinge cover mechanism that serves in parallel for lifting that casing part of the folding casing, which is conventionally supported by a base/supporting surface during use of the electric device by a user. In particular, the lift functionality shall be designed to effect a gradient inclination to the lifted casing part.

A third object of the present invention is to provide a hinge cover mechanism that allows for implementing frictional effects, which counteract opening and closing events without requiring supplementary components.

A fourth object of the present invention is to provide a hinge cover mechanism that allows for implementing a securing mechanism, which ensures a locking of the folding casing in the close position such that accidental and undesired opening of the folding casing is substantially prevented.

A superordinate object of the present invention is to provide a hinge cover mechanism, the components of which are manufactured and are assembled to the aforesaid hinge mechanism in an economic way. The economic manufacturing of the hinge cover mechanism may be obtained by components with a simple design, which may be put together quickly and easily.

SUMMARY OF THE INVENTION

The objects of the present invention are solved by a hinge cover mechanism and an electric device having a hinge cover mechanism, which are defined in claim 1 and claim 10, respectively. Preferred embodiments of the inventive hinge arrangement are defined in the dependent claims.

According to an aspect of the invention, a hinge cover mechanism for an electric device with a folding casing is provided. The folding casing is constituted by at least a first casing part and a second casing part, which are adjoined by a hinge mechanism to allow for pivot movement of the folding casing about a hinge pivot axis established by the hinge mechanism. The hinge cover mechanism comprises the hinge cover component with at least first pivot means and second pivot means. The first pivot means cooperate with the second casing part to allow pivot movement about a first cover pivot axis that is established by the first pivot means. The second pivot means cooperate with the first casing part to allow linear movement relative to the first casing part and pivot movement about a first cover pivot axis that is established by the second pivot means. During a pivot movement of the first casing part against the second casing part about the hinge pivot axis, i.e. during an opening movement of the folding casing, there occur substantially two movement ranges. In the first movement range the hinge cover component substantially moves linearly in a direction away from the first casing part forming an indentation between the first casing part and the hinge cover component. In the second movement range the hinge cover component moves linearly backwards and pivots simultaneously such that the hinge cover component performs totally a tilting movement. During the tilting movement a bottom part of the hinge cover component is lowered to touch a supporting surface on which the folding casing rests and the first casing part is lifted with respect to the supporting surface. The first pivot means and the second pivot means may be embodied as first pivot elements and second pivot elements, respectively, which engage correspondingly into the second casing part and the first casing part, respectively. Alternatively, the first pivot means and the second pivot means may be realized as first pivot elements and second pivot elements, respectively, being established in conjunction with the second casing part and the first casing part, respectively and which engage correspondingly into the hinge cover component.

According to an embodiment of the invention, the hinge pivot axis, the first cover pivot axis and the second cover pivot axis are different axes each being separated at predefined distances. Further the distance between the hinge pivot axis and the first cover pivot axis is substantially shorter than said distance between said hinge pivot axis and said second cover pivot axis to allow the above described linear and pivot movements of the hinge cover component.

According to an embodiment of the invention, the substantially linear movement obtained during the movement ranges is guided substantially parallel to a resting surface of the first casing part.

According to an embodiment of the invention, the substantially linear movement obtained during the movement ranges may be guided by groove elements, which may be formed in the first casing part or which may be alternatively formed in the hinge cover component. The groove elements accept the second pivot means for linear sliding and pivot movement.

According to an embodiment of the invention, the groove elements are formed as elongated holes which are dimensioned to guide the second pivot means and therefore to allow linear and pivot movement thereof.

According to an embodiment of the invention, the tilting movement of the hinge cover component comprises an inclination of the hinge cover component at a cover inclination angle and an inclination of the first casing part at a casing inclination angle. These inclination angles are contra-inclining angles.

According to an embodiment of the invention, the first casing part is lifted at a distance substantially beneath the second cover pivot axis, i.e. the second pivot means, during tilting movement.

According to an embodiment of the invention, the groove elements have given dimensions parallel to a resting surface of the first casing part. The given dimensions determine the substantially linear movement of the hinge cover component.

According to an embodiment of the invention, the hinge cover mechanism additionally comprises a locking mechanism that is at least adapted to ensure that said folding casing could not accidentally open independently. That means, the folding casing opens only on manual operation performed by a user. Moreover, the locking mechanism may be designed to ensure that a once opened folding casing remains in its current open position, i.e. the casing opening angle is maintained by the locking mechanism. Such maintenance of the opening angle may be obtained by taking advantages of frictional effects.

According to a distinct embodiment of the invention, the locking mechanism includes at least a resilient element, a pin element and a pin acceptance element formed in the hinge cover component. The pin element engages with a given pretension into the pin acceptance element in a closed position of the folding casing. The given pretension is applied by the resilient element driving the pin element into the pin acceptance element. In any open position, a given pretension may be applied by the resilient element driving the pin element against a counter surface that effects frictional effects.

According to an embodiment of the invention, the hinge cover component serves to protect an electric conduction means routed though the hinge mechanism and connecting electric components enclosed in the casing parts, wherein the protection is maintained during pivot movement.

According to an aspect of the invention, an electric device hinge with a folding casing is provided. The folding casing is constituted by at least a first casing part and a second casing part, which are adjoined by a hinge mechanism to allow pivot movement of the folding casing about a hinge pivot axis established by the hinge mechanism. The hinge cover mechanism comprises the hinge cover component with at least first pivot means and second pivot means. The first pivot means cooperate with the second casing part to allow pivot movement about a first cover pivot axis established by the first pivot means. The second pivot means cooperate with the first casing part to allow linear movement relative to the first casing part and pivot movement about a first cover pivot axis established by the second pivot means. During a pivot movement of the first casing part against the second casing part about the hinge pivot axis, i.e. during an opening movement of the folding casing, there occur substantially two movement ranges. In the first movement range the hinge cover component substantially moves linearly in a direction away from the first casing part forming an indentation between the first casing part and the hinge cover component. In the second movement range the hinge cover component moves linearly backwards and pivots simultaneously such that the hinge cover component performs totally a titling movement. During the titling movement a bottom part of the hinge cover component is lowered to touch a supporting surface on which the folding casing rests and the first casing part is lifted with respect to the supporting surface.

According to an embodiment of the invention, the hinge pivot axis, the first cover pivot axis and the second cover pivot axis are different axes each being separated at predefined distances. Further the distance between the hinge pivot axis and the first cover pivot axis is substantially shorter than said distance between said hinge pivot axis and said second cover pivot axis to allow the above described linear and pivot movements of the hinge cover component.

According to an embodiment of the invention, the substantially linear movement obtained during the movement ranges is guided substantially parallel to a resting surface of the first casing part.

According to an embodiment of the invention, the substantially linear movement obtained during the movement ranges may be guided by groove elements, which may be formed in the first casing part or which may be alternatively formed in the hinge cover component. The groove elements accept the second pivot means for linear sliding and pivot movement.

According to an embodiment of the invention, the groove elements are formed as elongated holes which are dimensioned to guide the second pivot means and therefore to allow linear and pivot movement thereof.

According to an embodiment of the invention, the tilting movement of the hinge cover component comprises an inclination of the hinge cover component at a cover inclination angle and an inclination of the first casing part at a casing inclination angle. These inclination angles are contra-inclining angles.

According to an embodiment of the invention, the first casing part is lifted at a distance substantially beneath the second cover pivot axis, i.e. the second pivot means, during tilting movement.

According to an embodiment of the invention, the groove elements have given dimensions parallel to a resting surface of the first casing part. The given dimensions determine the substantially linear movement of the hinge cover component.

According to an embodiment of the invention, the hinge cover mechanism additionally comprises a locking mechanism that is at least adapted to ensure that said folding casing could not accidentally open independently.

According to an embodiment of the invention, the hinge cover component serves to protect an electric conduction means routed though the hinge mechanism and connecting electric components enclosed in the casing parts, wherein the protection is maintained during pivot movement.

BRIEF DESCRIPTION OF THE DRAWINGS

The accompanying drawings are included to provide a further understanding of the present invention and are incorporated in and constitute a part of this specification. The drawings illustrate embodiments of the present invention and together with the description serve to explain the principles and inventive concept of the invention without limiting thereto. In the drawings, FIG. 1(*a–e*) shows illustratively schematic side views of an electric device having a hinge cover in different open positions according to an embodiment of the invention;

FIG. 2(*a–c*) shows illustratively schematic side views of an electric device having a hinge cover in different open positions according to an embodiment of the invention;

DETAILED DESCRIPTION

In the drawings, similar and same components and elements of the hinge mechanism according to an embodiment of the invention will be indicated by same reference numerals to enhance the intelligibility of the description.

The present invention relates to electric devices, electronic devices, terminals, and the like which are designed with a folding casing being constituted of at least two casing parts which are pivoted joined with a hinge mechanism. The electric device shall particularly comprise any microprocessor-based terminal such as portable computers (laptop-sized, notebook-sized, sub-notebook-sized computers), portable personal digital assistants (PDAs), portable personal digital organizers, mobile communications enabled terminals, i.e. for instance mobile phones, mobile communicators, mobile communications enhanced PDAs and any portable terminal of similar types which may also include gaming devices by way of illustration. The above given enumeration of possible electric/electronic devices is not to be understood as limiting but illustrative.

Figure 1:
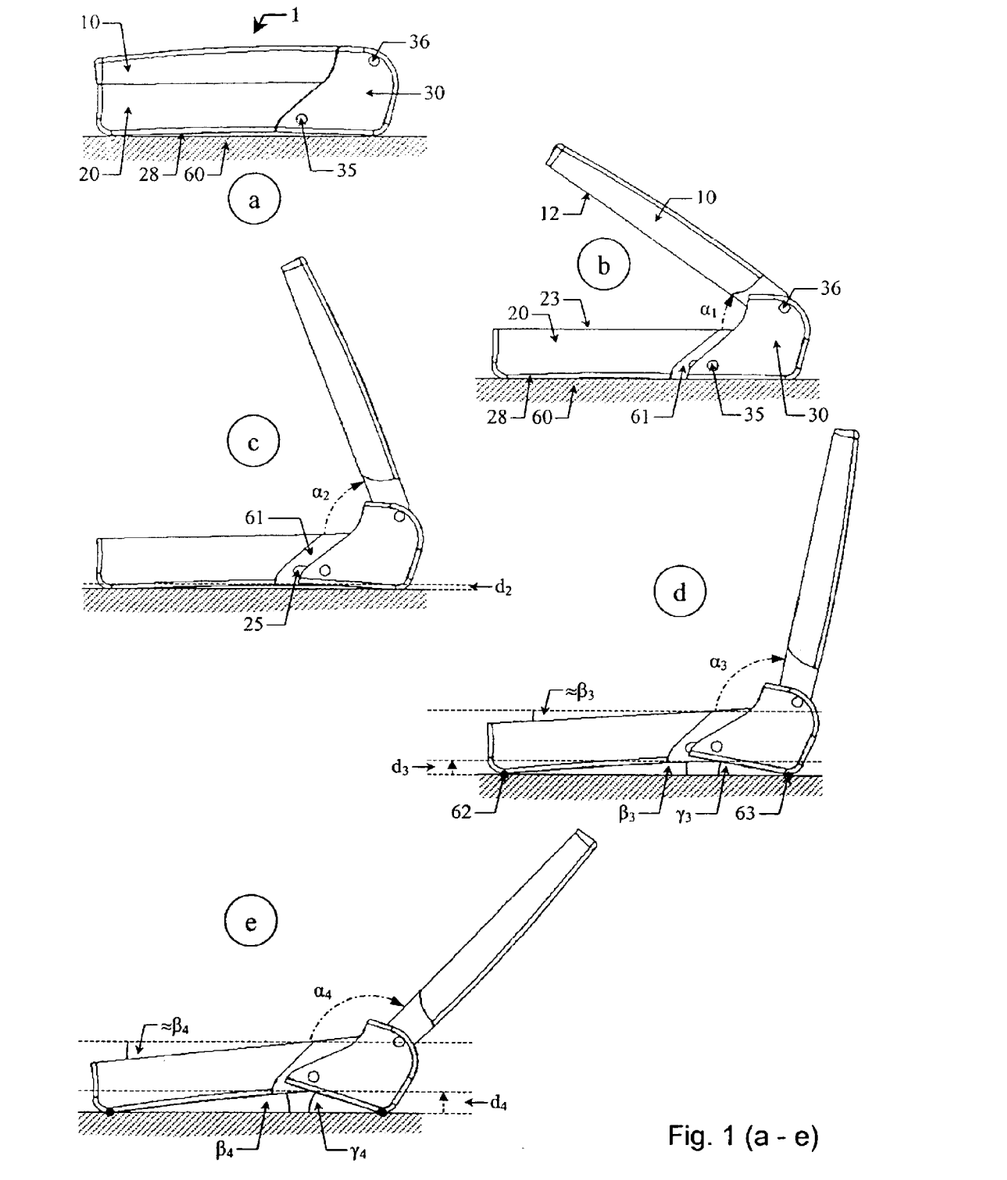

FIG. 1(*a–e*) shows illustratively schematic side views of an electric device 1 having a hinge cover component 30. The schematic side views portray the outer appearance of the electric device 1 in different open positions, which is visible to a user opening the electric device.

In detail, the electric device 1 is constituted by a folding casing, which is established by two casing parts and casing halves herein, respectively, one of which is the (main) body casing 20 and the other one is a top casing 10. Conventionally, the top casing 10 may accomodate display means such as a TFT display, a LCD display, a polymer display and the like, whereas the body casing 20 may typically accommodate the major part of the electronics, operating means such as keys, keypads, keyboards, touchpads etc. and further obligatory and optional components, respectively. The division of functional and electronic components among the casing parts of the folding casing of the electronic device 1 as enlightened above illustratively is out of the scope of the invention such that the invention is not limited thereto.

Consequently, it could be assumed without limitation thereto that the body casing 20 integrates at least a keyboard, whereas the top casing 10 integrates a display. Moreover, the keyboard as well as the display may be arranged to be protected as the folding casing is in its close position and both keyboard and the display are presented to a user in open positions of the folding casing.

Those skilled in the art will appreciate that the depicted side views illustrate those of the sides of the electric device 1 with folding casing, perpendicular to which the pivot axis of the folding casing extends. It shall be noted that those skilled in the art will further appreciate that those of the sides of the electric device 1, which are not explicitly depicted and which are situated opposite to those depicted one, are similarly and symmetrically embodied, respectively, such that depiction thereof may be omitted without limiting the invention.

The FIG. 1a illustrates the folding casing in its close position. A base/supporting surface 60 such as a table and similar rest, onto which the electric device 1 is placed, supports the electric device 1. In close position of the folding casing of the electric device 1 the body casing 20 and the top casing 10 are stacked onto each other, which effects that at least one surface of the body casing 20 and one surface of the top casing 10 face towards each other and are adjacent to each other. Accordingly, the body casing 20 has a resting surface 28, which rests against the base/supporting surface 60 when the electric device 1 is appropriately placed on the supporting surface 60, i.e. in accordance with the purpose and function of the electric device 1. Further the body casing 20 has an exposable surface 23, which rests against and is adjacent to an exposable surface 12 of the top casing 10 when the folding casing comprising the body casing 20 and the top casing 10 is closed.

The exposable surface 23 of the body casing 20 is suitable for integration of the keyboard, whereas the exposable surface 12 of the top casing 10 is suitable for integration of the display as mentioned above for the way of illustration. The stacked arrangement of the body casing 20 and the top casing 10 protects at least both the integrated keyboard and the display as the folding casing is closed. It shall be noted that further components, which may be also, integrated into the aforementioned surfaces of the casing parts 20 and 10, are protected.

A hinge cover component 30 serves as a cover in the region of the hinge mechanism, which allows for pivoting about a pivot axis to open and close the folding casing. The hinge cover component 30 is designed to fit substantially seamless with the body casing 20 and the top casing 10 as the folding casing is closed. The hinge cover component 30 is attached to the body casing 20 and the top casing 10 by a journal, which is realized by pivot elements. The design function of the journal will be apparent with reference to the following schematic perspective views depicting different open positions of the folding casing and the electric device 1, respectively.

At least a first pivot element 36 and a second pivot element 35 are provided for engaging with the top casing 10 and the body casing 20. Further, the second pivot element 35 is allowed for pivoting and for sliding, wherein the sliding movement is limited by a groove element 25.

It shall be noted that the elements described with reference to FIG. 1a, especially the first pivot element 36, the second pivot element 35 and the groove element 25 are provided symmetrically for the opposite side of the electric device, which is not explicitly depicted. That means, the folding casing of the electric device 1 has at least two first pivot elements 36, two second pivot elements 35 and two groove elements 25, one of each provided for on either side.

The following FIGS. 1b to 1e illustrate stepwise at distinct opening angles α an opening movement of the folding casing being constituted by two casing halves, i.e. the body casing 20 and the top casing 10, forming to casing of the electric device 1.

The FIG. 1b illustrates the folding casing in a first open position with a casing opening angle $\alpha_1$. The opening of the folding casing of the electric device may be manually operable with a user. During opening the user may take hold on the top casing 10 for pivot movement about the pivot axis established by the hinge mechanism (not shown in FIG. 1, refer to FIGS. 2 and 3 for detailed depiction) adjoining the body casing 20 and the top casing 10. That means the casing opening angle $\alpha_1$ corresponds to a pivot angle about the pivot axis, about which the top casing 10 is pivoted with respect to the body casing 20. In parallel to the pivoting of the top casing 10 about the pivot axis, the first pivot element 36 and the second pivot element 35 allow the hinge cover component 30 to pivot simultaneously thereabout. The second pivot element 35, which engages in the groove element 25, primarily slides within the groove element 25 for the present and pivots only slightly. As a result, the hinge cover component 30 essentially moves parallel to the supporting surface 60 away from the body casing 20 such that an indentation 61 is formed between body casing 20 and hinge cover component 30.

The maximum extent of the indentation 61 is predefined and delimited by the transition of second pivot center C2 in a direction parallel to the groove element 25.

The groove element 25 limits only the direction of sliding movement. It is meant that there remains a gap between groove 25 end and shaft 41 to avoid breakage of any part. The shape and dimensions of the groove element 25 will be detailed referred to in FIG. 3. Substantially, the extent of the indentation 61 and the movement of the hinge cover component 30 essentially parallel to the supporting surface 60 is predefined by parallel transition of second pivot center C2 in a direction parallel to the groove element 25. Consequently, the substantially parallel movement of the hinge cover component 30 is limited to an opening angle range extending from close position (i.e. minimum opening angle) to a predefined opening angle.

The FIG. 1c illustrates the folding casing in a first open position with a casing opening angle $\alpha_2$. That means, the top casing 10 is pivoted about the hinge mechanism adjoining the top casing 10 and the body casing 20 and establishing the corresponding pivot axis about the pivot angle substantially equal to the casing opening angle $\alpha_2$. In parallel to the pivoting of the top casing 10 about the pivot axis, the first pivot element 36 and the second pivot element 35 allow the hinge cover component 30 to pivot simultaneously thereabout; where the second pivot element 35 has reached its maximal sliding location within the groove element 25, in consequence on which the second pivot element 35 begins to pivot. As stated above with respect to FIG. 1b the substantially parallel movement of the hinge cover component 30 is limited by the dimensions of the groove element 25, which is partially visible in FIG. 1c and indicated with reference numeral 25.

The previous substantially parallel movement is transferred into complex movement which may be appreciated as a sliding movement of the second pivot element 35 and a pivot movement about the second pivot element 35. The casing opening angle $\alpha_2$ may be designated as the maximal opening angle, up to which the second pivot element 35 primarily slides within the groove element 25 which effects the substantially parallel movement of the hinge cover component 30. Consequently, when pivoting the top casing 10 to the opening angle $\alpha_2$ a considerable pivot movement about both the first pivot element 36 and an additionally slight pivot movement about the second pivot element 35 takes place. Further pivot movement of the top casing 10 will effect the second pivot element 35 to slide back in the groove element 25 in a direction towards the indentation 61, which is constituted by the substantially parallel movement of the hinge cover component 30 up to now.

As a result, the hinge cover component 30 inclines slightly at a cover inclination angle $\gamma_2$ (not shown) and forces the body casing to incline at a body inclination angle $\beta_2$ (not shown), as well. For that reason, a triangular-shaped cavity is established between the body casing 20 and the supporting surface 60, i.e. the triangular-shaped cavity is formed between the resting surface 28 of the body casing 20, which rests against the supporting surface 60 in the close position of the folding casing, and the supporting surface 60. Therefore, the exposable surface 23 of the body casing 20, which gets exposed as the folding casing is opened, is inclined simultaneously at an inclination angle substantially equal to the body inclination angle $\beta_2$ (not shown). In particular, this applies as both the resting surface 28 and the exposable surface 23 of the body casing 20 are substantially parallel. Further the formation of the triangular-shaped cavity effects a rise of the height of the triangular-shaped cavity, which is designated as distance $d_2$, herein. The rise about the distance $d_2$ is obtained in the region of the cover journal and in particular substantially beneath the second pivot element 35.

The FIG. 1d illustrates the folding casing in a second open position with a casing opening angle $\alpha_3$, which is greater than the casing opening angle $\alpha_2$. That means, the top casing 10 is pivoted about the hinge mechanism adjoining the top casing 10 and the body casing 20 and establishing the corresponding pivot axis about the pivot angle substantially equal to the casing opening angle $\alpha_3$. In parallel to the pivoting of the top casing 10 about the pivot axis, the first pivot element 36 and the second pivot element 35 allow the hinge cover component 30 to pivot simultaneously thereabout. The second pivot element 35, which engages in the groove element 25, slides additionally within the groove element 25 but in the backward direction towards the previously completely established indentation 61.

In consequence to the increased casing opening angle, both the body inclination angle $\beta_3$ of the body casing 20 and the cover inclination angle $\gamma_3$ of the hinge cover component 30 increase in comparison with the body inclination angle $\beta_2$ and the cover inclination angle $\gamma_2$, respectively. Due to the increase of the inclination angles $\gamma_3$, $\beta_3$ the triangular-shaped cavity grows, which implies that the height of the triangular-shaped cavity grows as well, i.e. the distance $d_3$ increases in comparison with the distance $d_2$ introduced and explained above. Therefore, the exposable surface 23 of the body casing 20 inclines simultaneously at an inclination angle substantially equal to the body inclination angle $\beta_3$. Due to the increase of the body casing 20 about the distance $d_3$ resulting for the formation of the triangular-shaped cavity being constituted by the inclination angles $\gamma_3$, $\beta_3$ the body casing 20 and the cover hinge component 30 rest at line-like support areas 62 and 63 on the supporting surface 60, respectively.

The FIG. 1e illustrates the folding casing in a first open position with a casing opening angle $\alpha_4$. The casing opening angle $\alpha_4$ may be the maximum casing opening angle $\alpha_4$, which in turn is greater than the casing opening angle $\alpha_3$. That means, the top casing 10 is pivoted about the hinge mechanism adjoining the top casing 10 and the body casing 20 and establishing the corresponding pivot axis about the pivot angle substantially equal to the casing opening angle $\alpha_4$. In parallel to the pivoting of the top casing 10 about the pivot axis, the first pivot element 36 and the second pivot element 35 allow the hinge cover component 30 to pivot simultaneously thereabout. The second pivot element 35, which engages in the groove element 25, still slides additionally within the groove in the direction towards the established indentation 61.

In consequence to the increased casing opening angle, both the body inclination angle $\beta_4$ of the body casing 20 and the cover inclination angle $\gamma_4$ of the hinge cover component 30 increase in comparison with the body inclination angle $\beta_3$ and the cover inclination angle $\gamma_3$, respectively. Due to the increase of the inclination angles $\gamma_4$, $\beta_4$ the triangular-shaped cavity grows, which implies that the height of the triangular-shaped cavity grows as well, i.e. the distance $d_4$ increases in comparison with the distance $d_3$ introduced and explained above. Therefore, the exposable surface 23 of the body casing 20 inclines simultaneously at an inclination angle substantially equal to the body inclination angle $\beta_3$. Due to the increase of the body casing 20 about the distance $d_4$ resulting for the formation of the triangular-shaped cavity being constituted by the inclination angles $\gamma_4$, $\beta_4$ the body casing 20 and the cover hinge component 30 rest at line-like support areas 62 and 63 on the supporting surface 60, respectively.

Viewing the described FIG. 1a to FIG. 1e together shows for those skilled in the art the opening movement of the electric device 1 having a folding casing with a hinge cover component according to an embodiment of the invention. With increasing the opening angle $\alpha$ the inclination angles $\beta$ and $\gamma$ increases simultaneously as the opening angle $\alpha$ reaches a predefined opening angle (herein defined as opening angle $\alpha_2$). The formation of the inclination of the body casing 10 causes a substantially equal inclination about the body inclination angle $\beta$ of the exposable surface 23 of the body casing 20 and a rise of the body casing about a distance d beneath the second pivot element 35 of the hinge cover component 30, respectively. The electronic device with folding casing is conventionally operable with a user from a side of the body casing 20, which is situated opposite to the hinge mechanism of the folding casing and the top casing 10, respectively. For instance the body casing 20 and the exposable surface 23 may integrate an arrangement of key such as a keyboard for operating by the user. The inclination of the exposable surface 23 caused by the journal properties of the hinge cover component 30 due to the pivot movement about the first and second pivot elements 36, 35 effected by the pivot movement of top casing 10 serves for an ergonomic handling of the keys and the keyboard, respectively. The inclination for improving ergonomic handling of keys is known to those skilled in the art and is implemented today in most stand-alone keyboards e.g. for being connected to personal computers, where the keyboards have folding stands provided on the underside of the stand-alone keyboards. The hinge cover component 30 according to an embodiment of the invention is designed to provide a suitable inclination angle for the exposable surface 23 of the body casing 20.

Due to the fact that the electric device 1 rests on the supporting surface 60 at the line-like support areas 62 and 63 as the folding casing is opened sufficiently, i.e. for example approximately by an casing opening angle α greater than or equal to approximately the casing opening angle $α_2$, one or more anti-glide means such as pads with grip provided on the resting surface in the region of either the line-like support areas 62 and 63 or both may be advantageous for increasing a stable arrangement of the electric device 1 on the supporting surface 60.

Moreover, the enlightened linear and pivot movement of the hinge cover component 30 maintains the protection of the hinge mechanism covered by the hinge cover component 30 and likewise component arranged in the region adjacent to the hinge mechanism such as electric conductors connection electric or electronic components of the top casing 10 and body casing 20 with each other.

Figure 2:
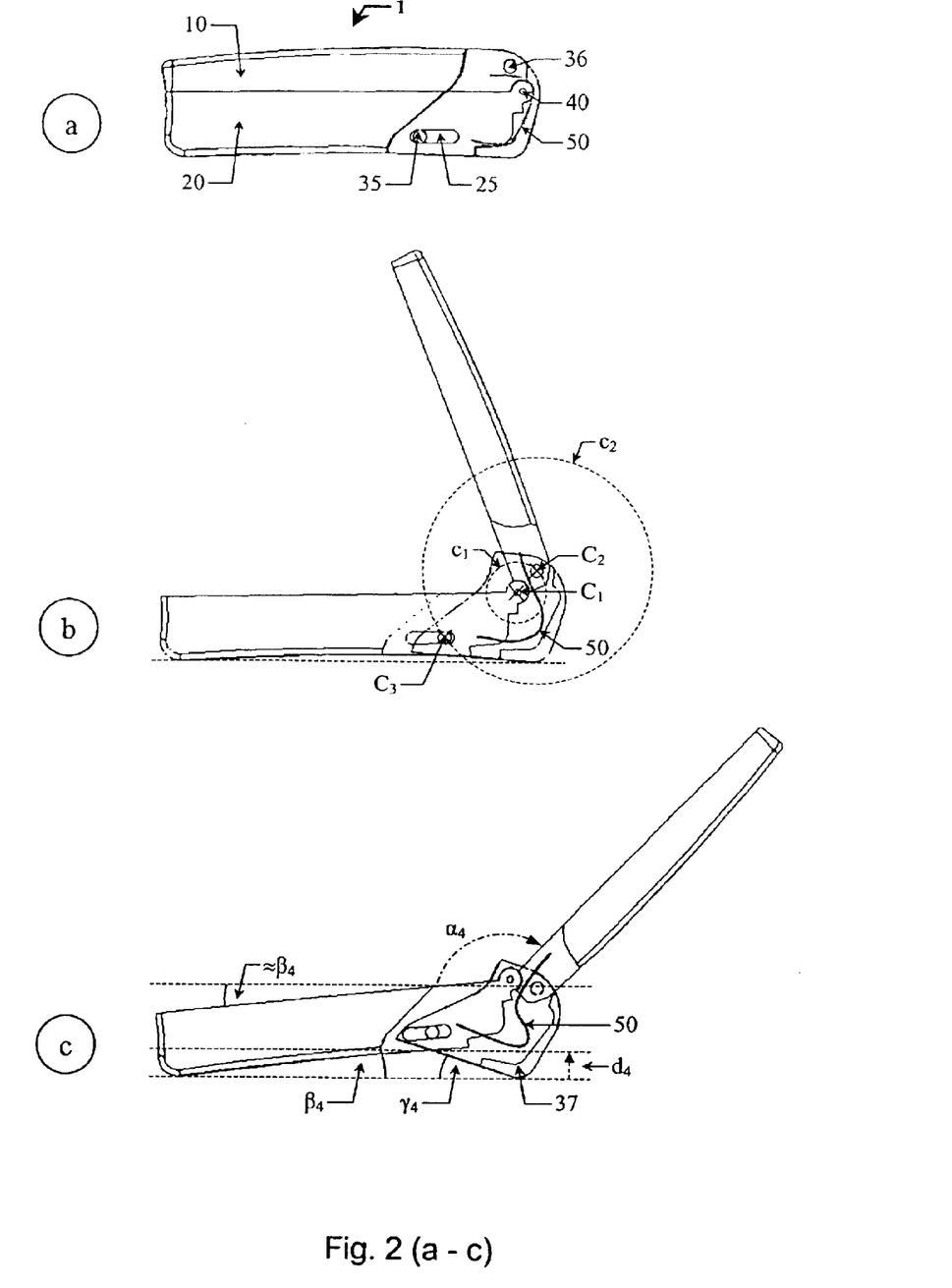

The following FIGS. 2a to 2c illustrate a selection of depictions given in FIG. 1, where the non-transparent hinge cover component 30 according to an embodiment of the invention is put into transparency. FIG. 2(a–c) shows illustratively schematic side views of an electric device having a hinge cover component 30 in different open positions according to an embodiment of the invention. Particularly, the illustration shown in FIG. 2a corresponds to the illustration depicted in FIG. 1a, the illustration shown in FIG. 2b corresponds to the illustration depicted in FIG. 1c and the illustration shown in FIG. 2c corresponds to the illustration depicted in FIG. 1e.

Referring to FIG. 2a the transparent embodied hinge cover component 30 according to an embodiment of the present invention opens the view to elements and components normally hidden by hinge cover component 30. Among others, the hinge mechanism 40, which allows for pivoting the top casing 10 and the body casing 20 against each other and the groove element 25 in which the second pivot element 35 engages are shown in detail. The hinge mechanism 40 establishes the pivot axis, about which the top casing 10 is pivoted against the body casing 20 when the user performs a pivot movement.

As described above in conjunction with FIG. 1b and FIG. 1c, respectively, FIG. 2a illustrates the groove element 25 with the engaging second pivot element 35 in its location, which is taken by the second pivot element 35, when the folding casing of the electric device 1 is in its close position. The groove element 25 is dimensioned to accept the second pivot element 35 for pivot and sliding movement. That means, the dimension of the groove element 25 substantially perpendicular to the supporting/base surface 60 corresponds essentially to the dimensions of the second pivot element 35 under consideration of a free play to allow for pivoting.

Further a possible routing of an electric conduction such as a flexible printed circuit (FPC) 50 through the hinge mechanism is indicated as a gray-scaled line. The flexible printed circuit (FPC) 50 traverses adjacent to the hinge mechanism the hinge cover component 30 and is accordingly protected thereby.

Referring to FIG. 2b it is shown the groove element 25 with the engaging second pivot element 35 in its maximal sliding location, which is taken by the second pivot element 35, when the parallel movement and the indentation 61 has obtained its maximal extent and the hinge cover component 30 starts to incline about its cover inclination angle γ. In addition FIG. 2b illustrates degrees of freedom in rotational and pivot movement, respectively. A first pivot center $C_1$ is established by the hinge mechanism 40, which adjoins the body casing 20 and the top casing 10 for pivoting about the hinge pivot axis of the folding casing of the electric device 1. The circular rotation line $c_1$ illustrates the theoretically allowed degrees of freedom in pivot movement of the first pivot element 36 defined by the hinge mechanism 40. Further, a second pivot center $C_2$ is established by the first pivot element 36 and defines the degrees of freedom in pivot movement of the second pivot element 35, which is illustrated by the circular rotation line $c_2$. The interacting of the degrees of freedom in pivot movement in conjunction with the freedom in movement of the second pivot element 35 within the groove element 25 results in the above described total movement of the hinge cover component 30 effecting simultaneously the movement of the casing body 20.

Due to the depicted side view shown in FIG. 2b, the statement given above relates to a planar illustration of the function of the aforementioned elements. Under consideration of a 3-dimensional extend of the shape of the electric device 1, the aforesaid first pivot center $C_1$ established by the hinge mechanism 40 identifies the position of the hinge pivot axis $C_1$ extending substantially perpendicular to the depicted side of the folding casing of the electric device 1 and passing through the first pivot center $C_1$. Further, the second pivot center $C_2$ established by the first pivot element 36 identifies analogously the position of the first cover pivot axis $C_2$ extending substantially perpendicular to the depicted side of the folding casing of the electric device 1 and passing through the first pivot element 36 being identical with the aforesaid second pivot center $C_2$. Moreover, a third pivot center $C_3$ established by the second pivot element 35 identifies analogously the position of the second cover pivot axis $C_3$ extending substantially perpendicular to the depicted side of the folding casing of the electric device 1 and passing through the second pivot element 35 being identical with the aforesaid third pivot center $C_3$. The second cover pivot axis $C_3$ is allowed for moving relatively within the groove element 25 as described above.

The first pivot element 36 and second pivot element 35 are separated at a predefined distance from each other, which means, that the first cover pivot axis $C_2$ and second cover pivot axis $C_3$ are separated at the same predefined distance from each other. Due to the symmetric design of the side of the electric device 1, the first cover pivot axis $C_2$ and second cover pivot axis $C_3$ are substantially parallel to each other, particularly the first cover pivot axis $C_2$ and second cover pivot axis $C_3$ are parallel to said hinge pivot axis $C_1$ and more particularly the first cover pivot axis $C_2$, second cover pivot axis $C_3$ as well as the hinge pivot axis $C_1$ are separate at predefined distances from each other.

Those skilled in the art will appreciate that the radius of the first circular rotation line $c_1$ defines a minimal dimension of the groove element 25 in the direction of the sliding movement. As aforementioned, the minimal dimension of the groove element 25 is advantageously extended by a predefined extent to prevent damages due to tensions that may occur in case the groove element 25 is dimensioned to short in the direction of the sliding movement.

Referring to FIG. 2c the top casing 10 is opened against the body casing about the casing opening angle $α_4$. The second pivot element 35, which engages in the groove element 25, slides within the groove in the direction towards the established indentation 61, i.e. slides back into the direction towards its location, which is taken by the second pivot element 35, when the folding casing of the electric device 1 is in its close position. The body casing 20 is inclined at a body inclination angle $\beta_4$, whereas the hinge cover component 30 is inclined at a cover inclination angle $\gamma_4$.

Viewing the FIGS. 2a to 2c together shows the flexible printer circuit (FPC) 50, which shall represent one possibility of an electric conduction between electronics encased by the body casing 20 and the top casing 10 without limitation thereto, protected by the hinge cover component 30 independent from the casing opening angle $\alpha$. Moreover, the design of the hinge cover component 30 according to the embodiment illustrated in FIG. 1 and FIG. 2 further enables for substantially free-movement of the flexible printer circuit (FPC) 50 to allow for suitable adaptation of the routing of the flexible printer circuit (FPC) 50 through the hinge cover component 30 such that damages effecting the flexible printer circuit (FPC) 50 are excludable.

Figure 3:
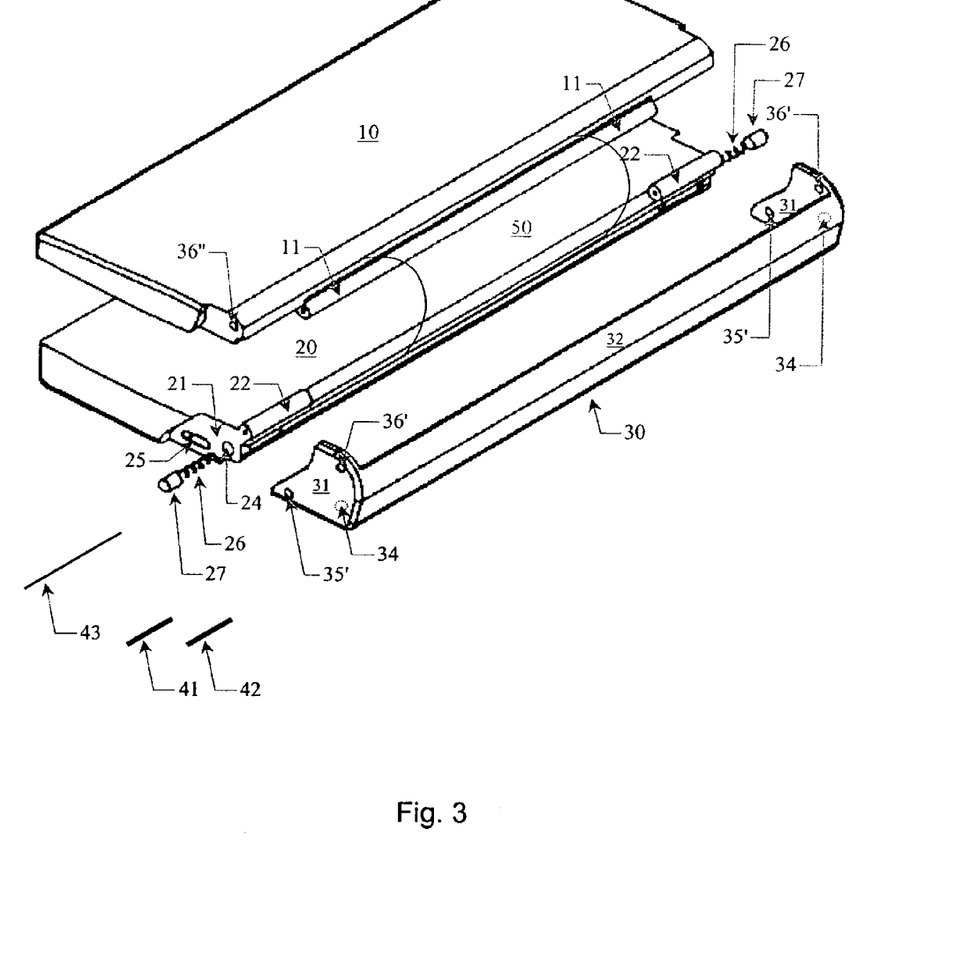
FIG. 3 shows illustratively a schematic perspective exploded view depicting components of an electric device with a folding casing having a hinge cover according to an embodiment of the invention.

FIG. 3 shows illustratively a schematic perspective exploded view depicting components of an electric device having a hinge cover according to an embodiment of the invention.

The illustration of FIG. 3 shows a perspective view of the top casing 10 and the body casing 20, where the exposable surface 23 of the body casing 20 is recognizable whereas the exposable surface 12 of the top casing 10 is hidden due to the selected perspective view. The top casing 10 and the body casing 20 are adjoined by a hinge mechanism for enabling pivot movement. The hinge mechanism 40 is formed by one or more top casing hinge elements 11 and one or more body casing hinge elements 22, which engage with each other to allow for pivot movement. According to the depicted embodiment the hinge elements 11 and 22 provide substantially tubular through-passages into which one or more hinge shaft elements 43 are to be included for establishing the hinge mechanism 40 with its pivot axis. The hinge mechanism 40 may be realized alternatively, the invention is not limited to a certain hinge mechanism. The flexible printed circuit (FPC) 50, which connects electric components enclosed by the top and body casings 10, 20 is depicted in a transparent illustration.

Further, the hinge cover component 30 according to an embodiment of the invention is shown in detail. The hinge cover component 30 is composed of side cover elements 31 and a back cover element 32 or linking element 32, which links the side cover elements 31. With reference back to FIGS. 2a to 2c, a sectional shape of the hinge cover component 30 according to an embodiment of the invention is depicted and indicated by reference numeral 37. The depicted sectional shape 37 corresponds to a cross-section, which may be obtained sectioning the hinge cover component 30 in accordance with a sectional plane substantially perpendicular to the pivot axis of the hinge mechanism 40.

The upper edge of the linking element 32 is designed to rest against the top casing 10 or is designed to exhibit only a slight gap to the top casing 10 in order to ensure the protection of the flexible printed circuit (FPC) 40 routed through the hinge cover component 30. The lower edge (hidden due to perspective view) of the linking element 32 is designed to rest against the body casing 20 or is designed to exhibit only a slight gap to the body casing 20 in order to ensure the protection of the flexible printed circuit (FPC) 40 routed through the hinge cover component 30. In case the edges rest against the casings 10 and 20 it shall be noted that the sliding and pivot movement of the hinge cover component 30 should not be obstructed which may be guaranteed by a appropriate design of the top and body casings 10, 20, respectively.

Pivot stop means may be provided to limit the pivot movement of the folding casing, i.e. the top casing 10 against the body casing 10, to a predefined range of angle from a minimal casing opening angle e.g. $\alpha=0°$ (in the close position) to a maximal casing opening angle $\alpha=\alpha_{max}$ (in the complete open position). The upper edge and the lower edge of the linking passage 32 may be employed as pivot stop means, where the edges get into contact with the body casing and the top casing such that further pivot movement is blocked, but it shall be noted that the invention is not limited to a certain realization of the pivot stop means.

The side cover elements 31 of the hinge cover component 30 exhibits arrangements for forming the aforesaid first pivot elements 36 and second pivot elements 35. According to the depicted embodiment of the hinge cover component 30, each of the both side cover elements 31 have shaft acceptance elements 35' and 36', which are adapted for accepting pivot shaft elements 41 and 42, respectively, and which may be accomplished by though-passing cylindrical drill holes. The pivot shaft elements 41 and 42 are to be inserted into the shaft acceptance elements 35' and 36' such that projecting parts of the pivot shaft elements 41 and 42 engage into shaft acceptance elements 36" and the groove elements 25, respectively, where the shaft acceptance elements 36" may be accomplished by cylindrical recesses. The shaft acceptance elements 36' with the pivot shaft elements 42 projecting in an engaging manner into the shaft acceptance elements 36" serve to form the first pivot elements 36, whereas the shaft acceptance elements 35' with the pivot shaft elements 41 projecting in an engaging manner into the groove elements 25 serve to form the second pivot elements 35. That means, the first and second pivot elements 36, 35 are formed on either side of the electric device 1, one of which is depicted in FIG. 1 and FIG. 2 and described in detail with reference thereto.

It shall be noted that the pivot elements 36 and 35 may be realized in an alternative way without departing the scope of the invention. For instance, the pivot shaft elements 41 and 42 may be provided with press-fit coupling means, which allow for establishing a stable and durable connection once the pivot shaft elements 41 and 42 are inserted into corresponding press-fit acceptance means.

Moreover, those skilled in the art will appreciate on the basis of the teaching according to the present invention that analogously the groove element 25 formed in the body casing 20, i.e. in the hinge cover contact surface 21 may be alternatively formed in the side cover element 31, into which the second pivot element 35 engages that is realized, formed, attached or the like on the body casing 20, i.e. on the hinge cover contact surface 21.

Additionally, the depicted embodiment of the hinge cover component 30 illustrates a locking mechanism, which allows for securing the electric device 1 in the close and fully open position from undesired or accidental opening/closing. The locking mechanism comprises spring elements 26 and latch pin elements 27, which are to be inserted into spring acceptance elements 24 e.g. accomplished by cylindrical recesses in the body casing. One of the spring acceptance elements 24 can be appreciated in the perspective depicted hinge cover contact surface 21. The spring elements 26 pretensions the latch pin elements 27 to be stressed against the side cover elements 31. In the close position the pretension of the latch pin elements 27 effects a stressing thereof into latch pin acceptance elements 34, which may be realized as cylindrical recesses for accepting cylindrical shaped latch pin elements 27. When the top casing is effected to pivot movement, the latch pin elements 27 moved from the latch pin acceptance elements 34, which comprises a movement of the latch pin elements 27 against the spring pretension caused by the spring elements 26. Afterwards the latch pin elements 27 stresses against the side cover elements 31 of the hinge cover component 30 and slide during further pivot movement. Accordingly, a locking mechanism with a predefined force is realized, which counteracts against an opening movement of the electric device 1 being in close position.

The spring element 26 may be embodied as a spring, a spring rod etc. or may be realized by any resilient material having spring characteristics and properties as necessary for realizing the aforementioned locking mechanism. The invention is not limited to a certain embodiment of the spring element.

Static as well as the sliding friction of a hinge mechanism provides for robust, solid, reliable etc. feeling of the mechanical response of the hinge mechanism given by the handling of a folding casing, especially given during the pivot movement of the hinge mechanism and during movement of the casing parts. The conveyed feeling of the handling of folding casing is an essential feature for customers, which check the electronic device with the folding casing for the first time.

The hinge cover component 30 according to an embodiment of the invention may allow for realizing such static and sliding friction of the hinge mechanism, respectively. One possible solution is to take advantage of the contact between hinge cover component 30 and the body casing especially by contact surfaces established between hinge cover contact surfaces 21 and side cover elements 31. The free play between the side cover elements 31 of the hinge cover component 30 and the body casing may be dimensioned such that a predefined free play therebetween provide for a correspondingly predefined sliding friction effected from the sliding of the contacting surfaces of the body casing 20 and the side cover elements 31 against each other during pivot movements and provides for a correspondingly predefined static friction in parallel. The static friction has to be present for maintaining a certain casing opening angle α, which has been set by a user by pivot movement. When the folding casing of the electric device 1 is opened about casing opening angles α below the maximal casing opening angle, the static friction guarantees for maintaining the actually selected casing opening angle, which comprises a maintaining of this selected casing opening angle against a pivoting force caused by the weight of the top casing 10 being applied by the effecting gravity. Also during typing the friction and open-position locking prevents accidental closing of the device. Without good static friction it is possible to close the device by pressing the body casing 20 strong enough, i.e. face 28 slaps down on the support surface 60. In mobile use it is especially useful to have locking mechanism in open position.

The hinge cover component 30 according to another embodiment of the invention may allow for realizing such static and sliding friction of the hinge mechanism, respectively, in conjunction with the aforementioned locking mechanism. As stated above the latch pin elements 27 are pretensioned against the side cover elements 31 of the hinge cover component 30. In the closed position of the folding casing of the electric device 1 the pretension provides for forcing the latch pin elements 27 into the latch pin acceptance elements 34 formed inside of the side cover elements 31. In open positions of the folding casing of the electric device 1 the pretension provides for forcing the latch pin elements 27 against the inside surfaces of the side cover elements 31 at locations spaced apart (more or less) from the latch pin acceptance elements 34. The forcing of the latch pin elements 27 against the inside surfaces provides for a predefined static and sliding friction in open positions of the folding casing of the electric device 1. Therefore, the aforementioned remarks about the static and sliding friction applies also to this other embodiment of the hinge cover component 30.

Figure 4A:
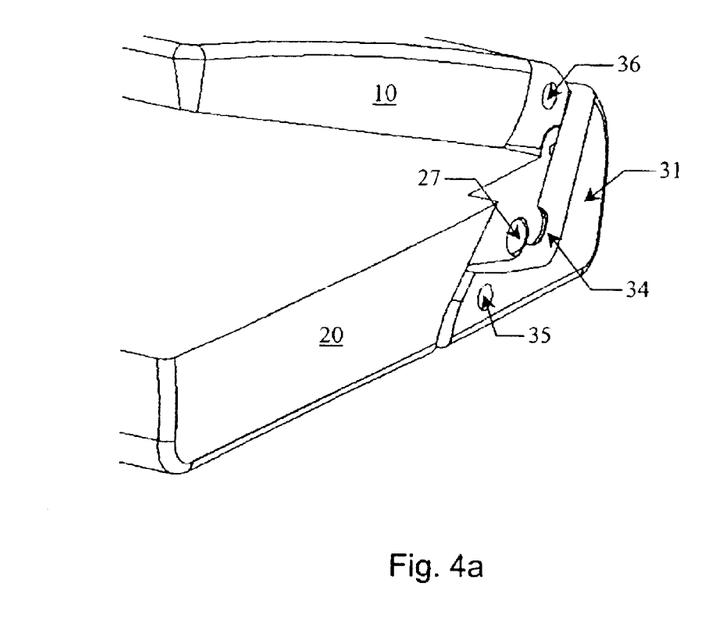
FIG. 4*a* shows illustratively a schematic perspective side view of a hinge cover in an open position according to an embodiment of the invention, wherein the hinge cover component is partially sectioned.
Figure 4B:
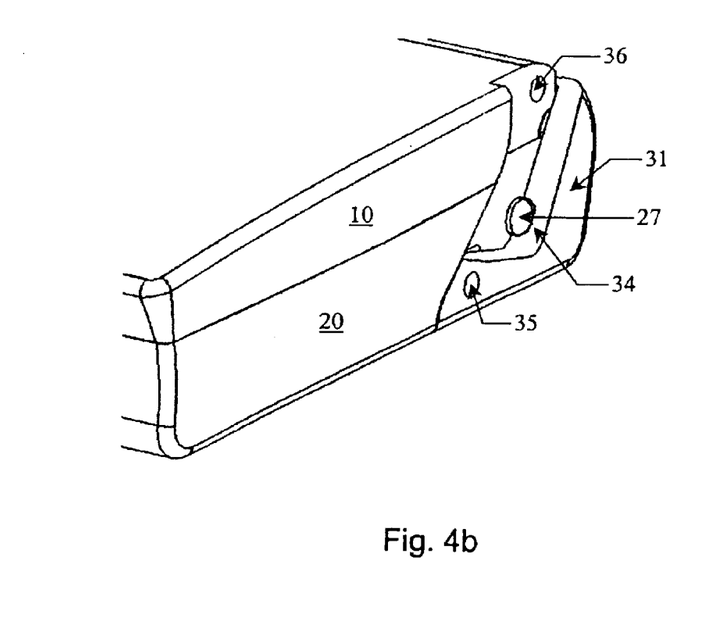
FIG. 4*b* shows illustratively a schematic perspective side view of a hinge cover in a close position according to an embodiment of the invention, wherein the hinge cover component is partially sectioned.

FIGS. 4a and 4b show illustratively schematic perspective side views of a hinge cover component according to an embodiment of the invention in a partially open position and in a closed position, respectively. The hinge cover component 30 is partially sectioned in both depictions. The FIG. 4a and 4b serve to describe the aforementioned locking mechanism in a more detailed way.

With reference to FIG. 3, the locking mechanism may be composed of a spring element 26 and a latch pin element 27, where the spring element 26 provides for a pretension to force the latch pin element 27 into a corresponding latch pin acceptance element 34 in the close position of the folding casing of the electric device 1 to prevent from undesired and accidental opening of the folding casing of the electric device 1. Also open-position lock is possible and preferable. In order to enlighten the function and the characteristics of this locking mechanism the side cover element 31 of the hinge cover component 30 is shown in a perspective view in a partially sectioned cutting through the latch pin acceptance element 34.

Now referring in detail to FIG. 4a, the folding casing of the electric device 1 is in any open position, i.e. there is observed a casing opening angle α>0° between the body casing 20 and the top casing 10. In accordance with the aforementioned functionality of the locking mechanism, the locking mechanism is released. Correspondingly, the observer of FIG. 4a may appreciate that the latch pin element 27 is moved from the corresponding latch pin acceptance element 34 such that the latch pin element 27 slides against and on the inside surface of the side cover element 31 of the hinge cover component 30 during pivot movement of the top casing 10 as long as the folding casing is in any open position. The pretension effected by the spring element 24 (not visible in FIG. 4a) forces the latch pin element 27 against the inside surface of the side cover element 31 and also provides for engaging of the latch pin element 27 into the corresponding latch pin acceptance element 34 as soon as close position of the folding casing is reached by pivot movement.

Now referring in detail to FIG. 4b, the folding casing of the folding casing of the electric device 1 is in the close position, i.e. there is observed a casing opening angle α=0° between the body casing 20 and the top casing 10. During close position the pretension effected by the spring element 24 (not visible in FIG. 4a) forces the latch pin element 27 against the inside surface of the side cover element 31 and consequently into the latch pin acceptance element 34 which is adequately dimensioned and positioned for accepting the latch pin element 27, respectively. A pivot movement of the top casing 10 against the body casing 20 about the pivot axis of the folding casing is prevented at first due to the projecting of the latch pin element 27 into the latch pin acceptance element 34. By applying a given torque value onto for example the top casing 10 in order to initiate a pivot movement for opening the folding casing the latch pin element 27 is forced in the direction towards the spring element 24, which yields by shortening its length due to a given force counteracting the tension of the spring element 24. The torque applied to the top casing 10 for example by manual handling causes a slight dislocation of the hinge cover component 30 such that edge parts of the latch pin acceptance element 34 exercise a force onto the latch pin element 27 and consequently onto the spring element 24 resulting in a driving force acting against the tension of the spring element 24 and resulting finally in a pressing back of the latch pin element 27. Hence, the engagement of the latch pin element 27 and the latch pin acceptance element 34 is neutralized and the locking due to the locking mechanism in the close position is released.

A rounded head of the latch pin element 27 serves for limiting the releasing force to be applied for releasing the latch pin element 27 from the latch pin acceptance element 34 by pivot movement to be reduced to a given predefined force. Consequently, the given predefined force determines the predefined given torque to be applied for exercising the releasing force.

Those skilled in the art will appreciate on the basis of the present invention that the presented embodiment of the locking mechanism is one locking mechanism of out of a group of possible locking mechanisms which are applicable for the same purpose as well. It shall be noted that the present invention is not limited to the specific embodied locking mechanism shown and described in detail above. Any other locking mechanism integratable into the hinge cover 30 is applicable.

Generally, electronics is typically liable to electrostatic danger, which is normally denoted as ESD. Electrostatic charges may be conveyed by electric conductor 50 and flexible printed circuit (FPC) 50 to the electronics connected thereby, respectively, and damages may result therefrom. Precautions should be taken to prevent such electrostatic danger due to conveyance of electrostatic charges. With reference to the hinge cover component 30 according to an embodiment of the invention a suitable selection of the material from which the hinge mechanism 10 is to be produced may reduce the ESD sufficient. Suitable selection of material may comprise a polymer material, which is resistant against electrostatic charging, or the material used for the hinge cover component 30 may be coated with a suitable coating at least in regions which may get in contact with the flexible printed circuit (FPC) 50 in order to prevent electrostatic charging.

Protrusions at the outside of the folding casing as often existing in conjunction with conventional hinge mechanism are interfering for a user of the folding casing and reduce the total usability thereof Referring to the inventive hinge cover component 30 according to an embodiment of the invention, of which perspective example illustrations are shown in the accompanying drawings protrusions are omitted by the design of the inventive hinge cover component 30. At least the elements and components responsible for pivot function of the folding casing are either included in and covered by the hinge cover component 30 itself, respectively, independently in close position and in any open position. The appearance and shape of the hinge cover component 30, i.e. parts of the hinge mechanism which is reachable from exterior of the hinge cover component 30, is substantially smooth, especially there are not any projections, protrusions etc.

Although the invention has been described with reference to particular embodiments thereof, it will be apparent to those ordinarily skilled in the art that modifications and variations to the described embodiments my be made without departing from the scope of the present invention, which is accordingly defined only by the claims appended.

REFERENCE NUMERALS

1 electronic device with folding casing
10 top casing
11 top casing hinge element
12 exposable surface (of the top casing 10)
20 body casing
21 hinge cover contact surface
22 body casing hinge element
23 exposable surface (of the body casing 20)
24 spring acceptance element
25 groove element
26 spring element
27 latch pin element
28 resting surface
30 hinge cover component
31 side cover component
32 linking element/back cover element
34 latch pin acceptance element (hidden)
35 second pivot element (of the hinge cover component 30)
36 first pivot element (of the hinge cover component 30)
37 sectional shape (of the hinge cover component 30)
35' shaft acceptance element (of the second pivot element 35)
36' shaft acceptance element (of the first pivot element 36)
36" shaft acceptance element (of the first pivot element 36)
37 sectional shape (of the hinge cover component 30)
40 casing hinge mechanism
41 pivot shaft element
42 pivot shaft element
43 hinge shaft element
50 electric conductor/flexible printed circuit (FPC)
60 supporting surface/base surface
61 indentation
62 first line-like support area
63 second line-like support area
$C_1$ first pivot center/hinge pivot axis
$C_2$ second pivot center/first cover pivot axis
$C_3$ second pivot axis
$c_1$ first circular rotation line/first circulation line
$c_2$ second circular rotation line/second circulation line
$d_j$ lift distance/height (where index $j \epsilon N$; $0<d_1<d_2< \ldots <d_n$)
$\alpha_j$ casing opening angle (where index $j \epsilon N$; $0<\alpha_1< \alpha_2< \ldots <\alpha_n$)
$\beta_j$ body inclination angle (where index $j \epsilon N$; $0<\beta_1< \beta_2< \ldots <\beta_n$)
$\gamma_j$ cover inclination angle (where index $j \epsilon N$; $0<\gamma_1< \gamma_2< \ldots <\gamma_n$)

What is claimed is:

1. A hinge cover mechanism for an electric device with a folding casing being constituted by at least a first casing part and a second casing part, said parts adjoined by a hinge mechanism; comprising:

a hinge cover component comprising at least first pivot means, which cooperate with said second casing part to allow movement of said hinge cover component about first cover pivot axis and second pivot means, which cooperate with said first casing part to allow both linear movement of said hinge cover component and pivotal movement of said hinge cover component about second cover pivot axis.

2. The hinge cover mechanism according to claim 1, wherein during a pivot movement of said first casing part with respect to said second casing part about said hinge pivot axis there are defined two movement ranges:

a first range in which said hinge cover component substantially moves linearly and a second range in which said hinge cover component moves linearly backwards and performs a tilting movement by which a bottom part of the hinge cover component is lowered to touch a supporting surface and by which said first casing part is lifted with respect to said supporting surface.

3. The hinge cover mechanism according to claim 1, wherein said hinge pivot axis, said first cover pivot axis and said second cover pivot axis are separate axes being spaced apart from each other at predefined distances, wherein said distance between said hinge pivot axis and said first cover pivot axis is substantially shorter than said distance between said hinge pivot axis and said second cover pivot axis.

4. The hinge cover mechanism according to claim 1, wherein said substantially linear movement is substantially parallel to a resting surface of said first casing part.

5. The hinge cover mechanism according to claim 1, wherein said substantially linear movement is guided by groove elements.

6. The hinge cover mechanism according to claim 4, wherein said groove elements are elongated holes dimensioned to guide said second pivot means and to allow linear and pivot movement thereof.

7. The hinge cover mechanism according to claim 1, wherein said tilting movement comprises an inclination of said hinge cover component at a cover inclination angle and an inclination of said first casing part at a casing inclination angle, wherein said cover inclination angle and said casing inclination angle are contra-inclining angles.

8. The hinge cover mechanism according to claim 1, wherein said hinge cover component substantially moves linearly in a direction away from said first casing part in said first movement range and said hinge cover component moves linearly backwards in a direction towards said first casing part in said second movement range.

9. The hinge cover mechanism according to claim 1, wherein said first casing part is lifted at a distance substantially beneath said second cover pivot axis.

10. The hinge cover mechanism according to claim 1, additionally comprising a locking mechanism that is at least adapted to prevent said folding casing from accidental opening.

11. The hinge cover mechanism according to claim 1, wherein said hinge cover component serves to protect at least electric conduction means routed though said hinge mechanism and connecting electric components enclosed in the casing parts; wherein the protection is maintained during any pivot movement.

12. An electric device with a folding casing being constituted by at least a first casing part and a second casing part, said parts adjoined by a hinge mechanism to allow for pivot movement about a hinge pivot axis established by said hinge mechanism, comprising:

a hinge cover component comprising at least first pivot means, which cooperate with said second casing part to allow movement of said hinge cover component about first cover pivot axis and second pivot means, which cooperate with said first casing part to allow both linear movement of said hinge cover component and pivotal movement of said hinge cover component about second cover pivot axis.

13. The electric device according to claim 12, wherein during a pivot movement of said first casing part with respect to said second casing part about said hinge pivot axis there are defined two movement ranges:

a first range in which said hinge cover component substantially moves linearly and a second range in which said hinge cover component moves linearly backwards performs a tilting movement by which a bottom part of the hinge cover component is lowered to touch a supporting surface and by which said first casing part is lifted with respect to said supporting surface.

14. The electric device according to claim 12, wherein said hinge pivot axis, said first cover pivot axis and said second cover pivot axis are separate axes each being spaced apart from each other at predefined distances, wherein said distance between said hinge pivot axis and said first cover pivot axis is substantially shorter than said distance between said hinge pivot axis and said second cover pivot axis.

15. The electric device according to claim 12, wherein said substantially linear movement is substantially parallel to a resting surface of said first casing part.

16. The electric device according to claim 12, wherein substantially linear movement is guided by groove elements.

17. The electric device according to claim 16, wherein said groove elements are elongated holes dimensioned to guide said second pivot means and to allow linear and pivot movement thereof.

18. The electric device according to claim 12, wherein said tilting movement comprises an inclination of said hinge cover component at a cover inclination angle and an inclination of said first casing part at an casing inclination angle, wherein said cover inclination angle and said casing inclination angle are contra-inclining angles.

19. The electric device according to claim 12, wherein said hinge cover component substantially moves linearly in a direction away from said first casing part in said first movement range and said hinge cover component moves linearly backwards in a direction towards said first casing in said second movement range.

20. The electric device according to claim 12, wherein said first casing part is lifted at a distance substantially beneath said second cover pivot axis.

21. The electric device according to claim 12, additionally comprising a locking mechanism that is at least adapted to prevent said folding casing from accidental opening.

22. The electric device according to claim 12, wherein said hinge cover component serves to protect at least electric conduction means routed though said hinge mechanism and connecting electric components enclosed in the casing parts; wherein the protection is maintained during any pivot movement.

* * * * *